United States Patent [19]
Kocian et al.

[11] Patent Number: 5,550,398
[45] Date of Patent: Aug. 27, 1996

[54] HERMETIC PACKAGING WITH OPTICAL

[75] Inventors: Thomas A. Kocian; Doug Darrow, both of Dallas, Tex.

[73] Assignee: Texas Instruments Incorporated, Dallas, Tex.

[21] Appl. No.: 489,244

[22] Filed: Jun. 12, 1995

Related U.S. Application Data

[62] Division of Ser. No. 332,229, Oct. 31, 1994.

[51] Int. Cl.$^6$ ................................................ H01L 31/0203
[52] U.S. Cl. .......................................... 257/434; 257/433
[58] Field of Search ................................. 257/434, 433, 257/680, 679

[56] References Cited

U.S. PATENT DOCUMENTS

| 4,420,386 | 12/1983 | White . |
| 5,043,139 | 8/1991 | Carnall, Jr. et al. . |

FOREIGN PATENT DOCUMENTS

| 60-107757 | 1/1985 | Japan | 257/434 |
| 60-258961 | 12/1985 | Japan | 257/434 |
| 61-174766 | 8/1986 | Japan | 257/434 |
| 1-110767 | 4/1989 | Japan . | |
| 1-110767 | 4/1989 | Japan | 257/434 |
| 0425776A1 | 8/1990 | Japan . | |
| WO90/13913 | 11/1990 | WIPO . | |

OTHER PUBLICATIONS

Darrow, D., et al., "A Comparative Analysis of Thin Film Metallization Methodologies for High Density Multilayer Hybrids," *1992 Proceedings Int'l Conf. on Multichip Modules*, Apr. 1–3, 1992, Denver, Colorado, Int'l Society for Hybrid Microelectronics (ISHM) and Int'l Electronics Packaging Society (IEPS).

Darrow, D., "High–Aspect Ratio Hole Coverage Using the Enhanced Ion–Plating Vacuum Deposition Process," Fall Meeting of Int'l Printed Circuits Society (IPC), Oct. 1994.

*Primary Examiner*—Sara W. Crane
*Assistant Examiner*—S. V. Clark
*Attorney, Agent, or Firm*—Warren L. Franz; W. James Brady, III; Richard L. Donaldson

[57] ABSTRACT

The invention is to a semiconductor package and method of making in which an optical glass window (23) is secured to a housing (20) at a low temperature. The optical glass (23) is etched and a metal layer (26) is formed on the etched surface. The metal layer is sealed to a metal frame (21) and the frame is sealed to a housing (20), or the deposited metal layer (26) is sealed directly to the housing (20).

10 Claims, 6 Drawing Sheets

5,550,398

HERMETIC PACKAGING WITH OPTICAL

This is a continuation of application Ser. No. 08/332,229, filed Oct. 31, 1994.

FIELD OF THE INVENTION

This invention relates to hermetically sealed semiconductor packages, and more particularly to a hermetically sealed semiconductor package with an optical quality glass window in the lid assembly and a temperature sensitive semiconductor optical device.

BACKGROUND OF THE INVENTION

In the past, hermetic sealing of temperature sensitive semiconductor packages that utilized glass optical windows required high temperature fusing of the glass to the package housing. In such sealing process, a glass frit is applied to a package or glass, and the glass window is fused to the package via the glass frit.

The high temperature that is required to fuse the glass to the glass frit results in a degradation of the optical properties of the glass window. The high temperature requirement also can cause degradation or destruction of the semiconductor chip. Prior art processes utilized circular windows on the device lid.

SUMMARY OF THE INVENTION

The invention relates to a hermetically sealed semiconductor package with an optical quality glass window that is sealed at a low temperature, and to the method of making the package with the optical quality window.

The method for making a semiconductor device package having an optical quality window includes the steps of, polishing an optical quality glass, and then etching a defined area on one surface of the glass. On this etched area is deposited a metal layer. This metal layer is then sealed to a metal frame which in turn is sealed to a housing.

The technical advance represented by the invention as well as the objects thereof will become apparent from the following description of a preferred embodiment of the invention, when considered in conjunction with the accompanying drawings and the novel features set forth in the appended claims.

DESCRIPTION OF A PREFERRED EMBODIMENT

Figure 1:
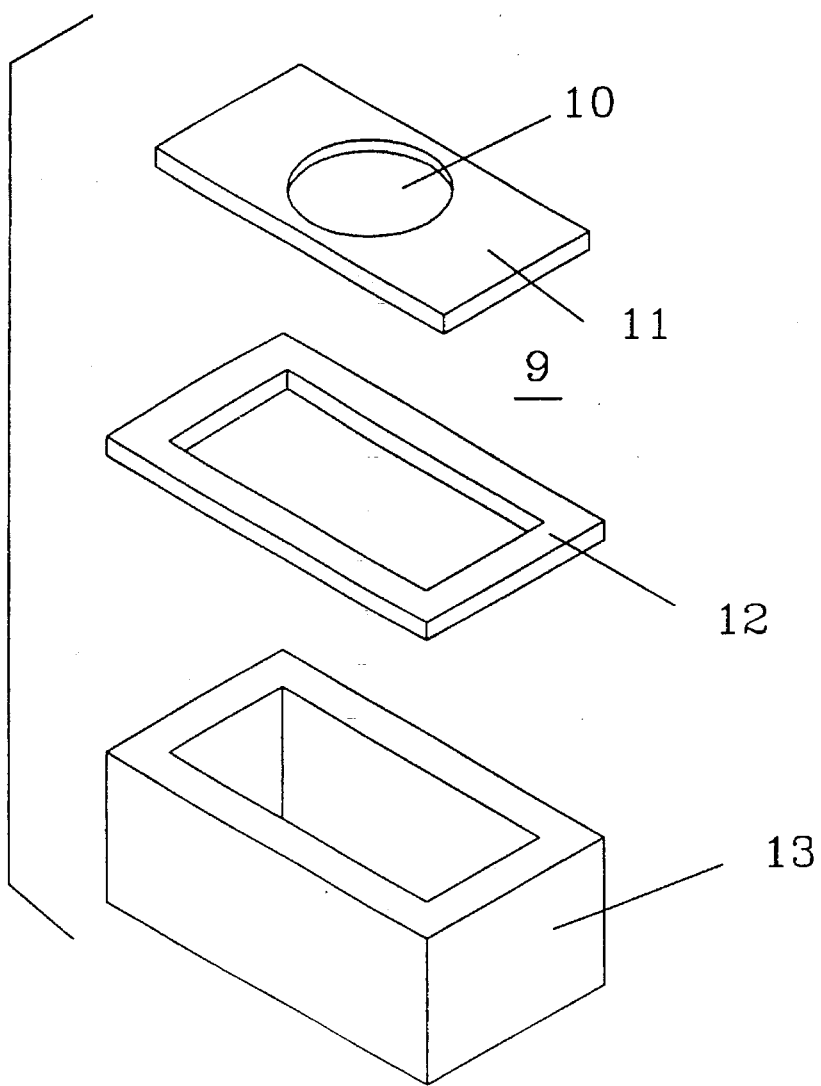
FIG. 1 is an exploded view of a prior art device providing a non-optical quality window in a semiconductor package utilizing a high temperature glass frit.
Figure 2:
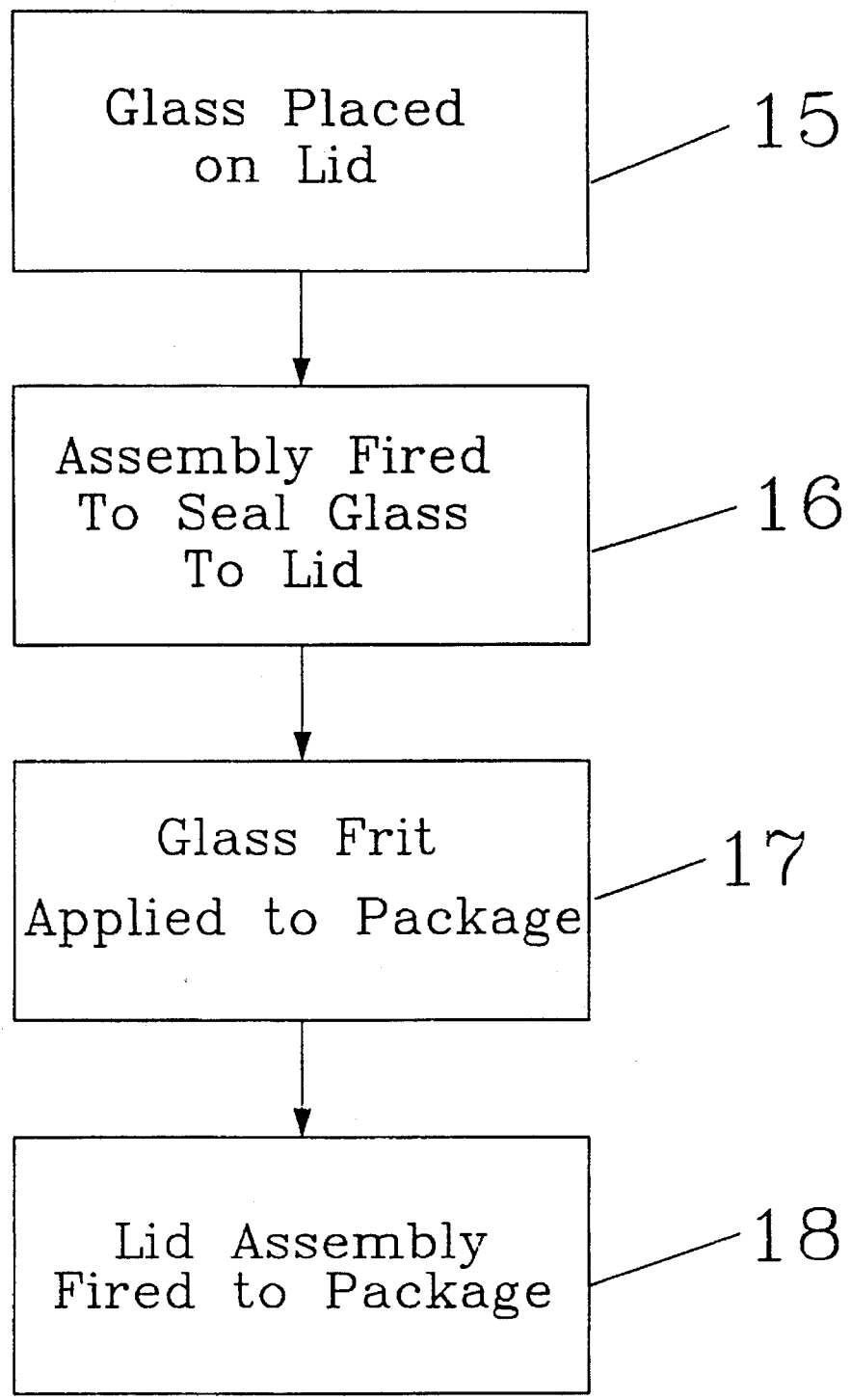
FIG. 2 shows the method steps according to a prior art process for providing a non-optical quality window in a semiconductor package utilizing a high temperature glass frit.

FIG. 1 shows an exploded view and FIG. 2 shows the steps of a prior art process for sealing a glass window to a semiconductor package. Referring to FIGS. 1 and 2, the glass 10 is placed, in step 15, on a ceramic or metal lid 11 that is to cover a semiconductor package 13. The glass-lid assembly 9 is fired or fused during a high temperature process in step 16 to hermetically seal the glass 10 into the lid 11. Next, a glass frit preform 12 is placed between the glass-lid assembly 9 and the package 13. Thereafter, the glass-lid assembly 9, the glass frit preform 12 and the package 13 are hermetically fused, thereby sealing lid 9 to package 13 by a high temperature firing process at step 18. The firing steps 16, 17, and 18 are at temperatures greater than 400 degrees Celsius. These high temperatures can cause damage to the semiconductor device in the package and degrade the optical properties of the glass window.

Figure 3A:
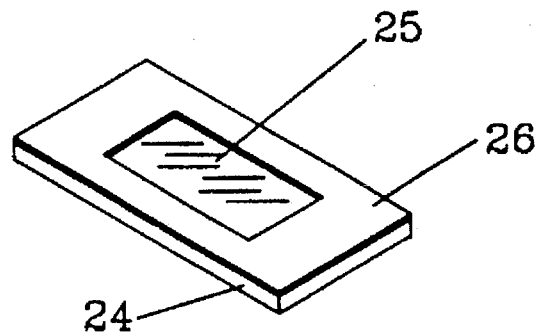
FIG. 3a shows the metallized layer on the optical glass.
Figure 3:
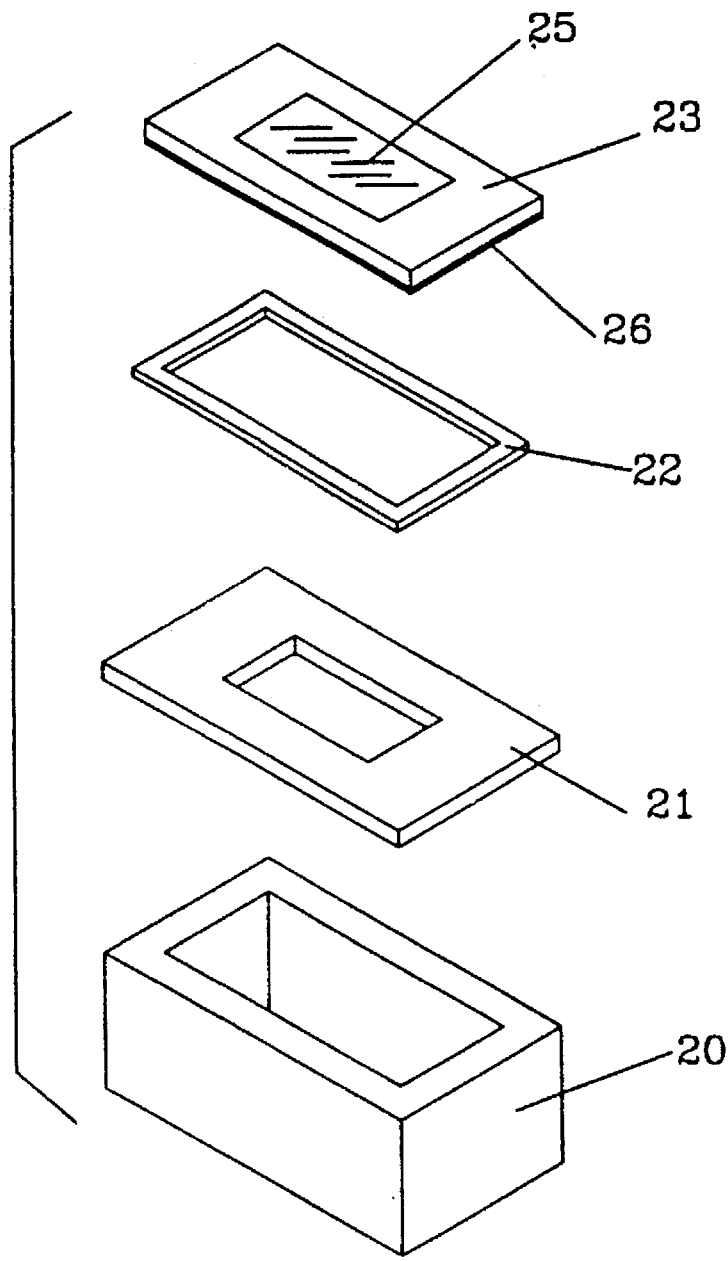
FIG. 3 is an exploded view of a semiconductor package with a optical glass lid assembly according to one embodiment of the invention.
Figure 4:
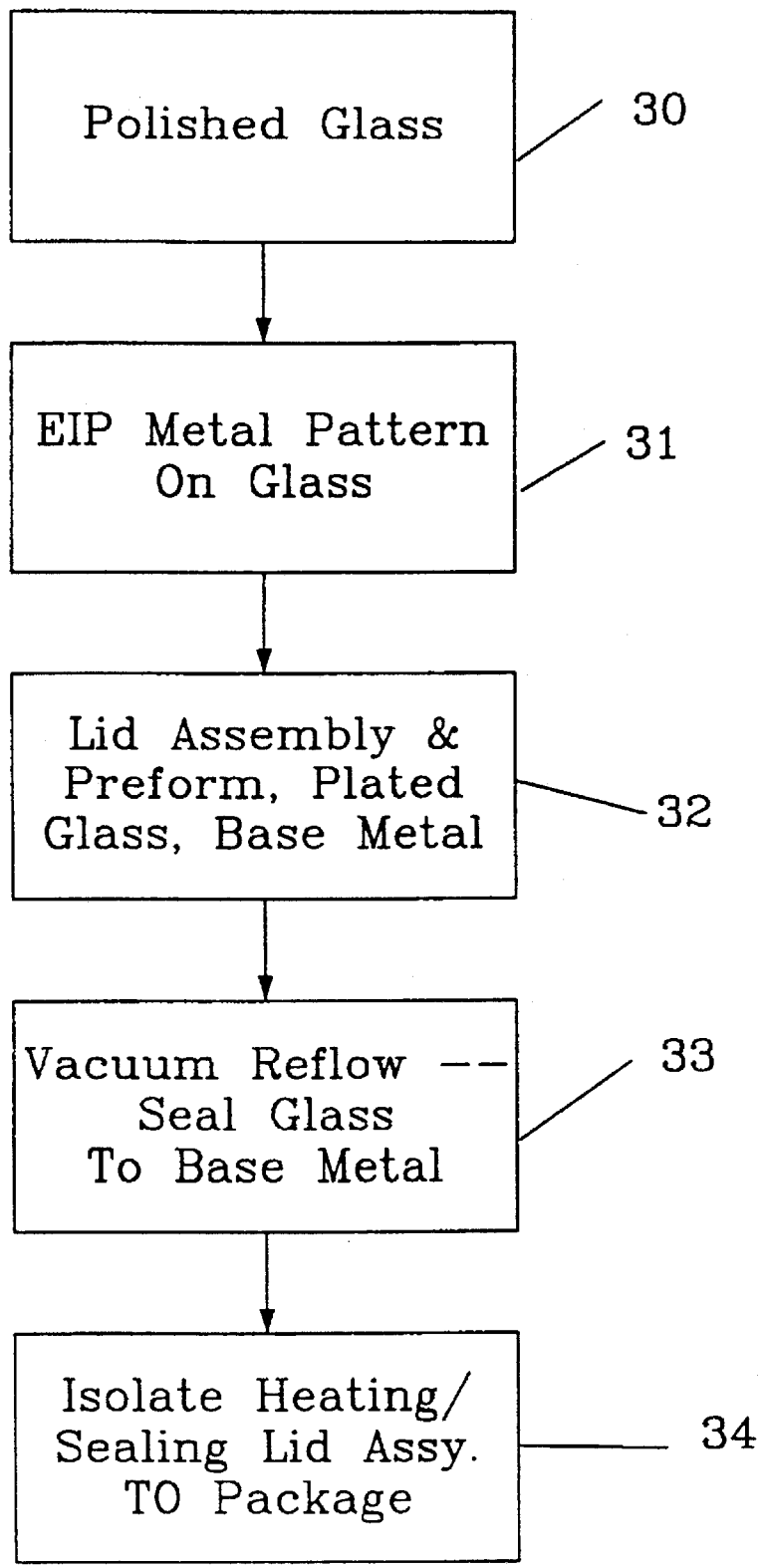
FIG. 4 shows the method steps according to the present invention for providing an optical quality lid assembly and sealing process in a semiconductor package.

FIG. 3 is an exploded view of an optical window package according to the present invention, FIG. 3a shows the back side of an optical glass plate 23 with a metallized surface 26, and FIG. 4 shows the process steps used in the packaging process. The packaging process includes a metal or ceramic package 20 into a cavity of which a semiconductor device is mounted. If package 20 is ceramic, it will have a metal seal ring for hermetic sealing processes. The metal or ceramic package 20 must have a coefficient of thermal expansion (CTE) that is closely matched to the CTE of the glass-lid assembly. Examples of the metal material are "Kovar" (Nickel/Iron/Cobalt) or Alloy 42 (Nickel/Iron), and examples of the ceramic material are alumina oxide ($Al_2O_3$), or alumina nitride (AlN).

The basic process is to polish the glass (step 30), deposit the metal pattern 26 (step 31) on the polished glass 23, which provides the lid assembly (step 32). The lid assembly is then sealed to the base metal frame 21 (stem 33), with solder preform 22, and then the lid/metal frame is sealed a rim which surrounds the cavity of to the package 20 (step 34).

The lid assembly consists of a metal frame 21, a solder preform 22, and a solderable optical glass 23. The solderable optical glass is a polished piece of glass that has good optical properties and a CTE that closely matches the metal frame 21. It may be, for example, Schott ZKN7 glass or a similar glass.

Optical glass plate 23, as shown in FIG. 3a, has a metal pattern 26 deposited annularly on its bottom surface, leaving a central portion or aperture 25 free of metalization which is the optical window. The metallization 26, which may be composed of Cr, Ni, and Au for example, are deposited with an ion-plating process. Ion-plating processes are vacuum depositions, usually with thermal evaporation sources, that involve high energy particle bombardment of the glass. Conventional ion-plating systems usually involve a direct current (DC) bias potential (−2 to −5 kV) or a radio frequency RF bias with an inert gas typically Argon (Ar) at a pressure of 5 to 200 mtorr. The Enhanced Ion-Plating (EIP) process uses an RF bias and, in some cases, a magnetic field as source of ionization, with an applied negative DC bias. The metal vapor itself is ionized without the use of the Ar plasma, although Ar is occasionally used for increased ion bombardment, but at a low pressure (approximately $1\times10^{-4}$ torr). The glass is biased and thus becomes the cathode of a low pressure electric charge, which results in a plasma or ion-assisted deposition. When ionized, the vapor particles are accelerated towards the glass, striking with energies that range from thermal to hundreds of electron volts. The benefit of using an ion-plating process like EIP is the increased adhesion obtained from the high arrival energy of the ionized evaporants. The increased adhesion of the metallization to the glass provides a strong hermetic solder joint.

Other metallization techniques, such as electroplating, sputtering, or evaporation, may be used to form the solderable metallization 26. However, EIP has been shown to have advantages over the other techniques including lower temperature, lower metallization stress, superior adhesion, better thickness uniformity, and reduced process complexity and variability. Another advantage of EIP is that it produces metallization layers that offer fine line dimensions (size, tolerance), so critical aperture dimensions can be obtained for optical devices.

The solder preform 22 may be, for example, 80% gold and 20% tin preform, or other similar ratios, for example 70% to 90% gold and 30% to 10% tin preform. The preform, which may be, for example, 0.002 inches thick, is utilized to form a hermetic solder between the metallized optical glass and the metal frame 21 by an infrared vacuum reflow heating process at step 33. The infrared vacuum reflow process has the advantage of minimizing the stress placed into the optical glass and solder joint by slowly increasing and decreasing the peak temperature to be obtained. Another advantage of the infrared vacuum reflow, as compared to conventional belt furnaces, is the ability to minimize the hermetic solder joint voiding, therefore, maximizing the hermeticity of the solder joint.

The lid assembly, made up of the optical glass 23 with metallized coating 26 and metal frame 21, is then attached to the housing 20 by using a localized or low temperature hermetic sealing process at step 34. One method of localized low temperature hermetic sealing is a Nd Yag laser sealing system. The lid assembly is aligned to the metal seal ring on the housing 20 and an edge-to-edge hermetic laser weld joint is produced. Although the laser creates a high temperature point source melting of base metals, the temperature of the heat sensitive optical device is not raised above ambient due to the heat dissipated through the metal. Other methods for hermetically sealing the lid assembly to the housing are seam welding or projection welding.

Figure 5:
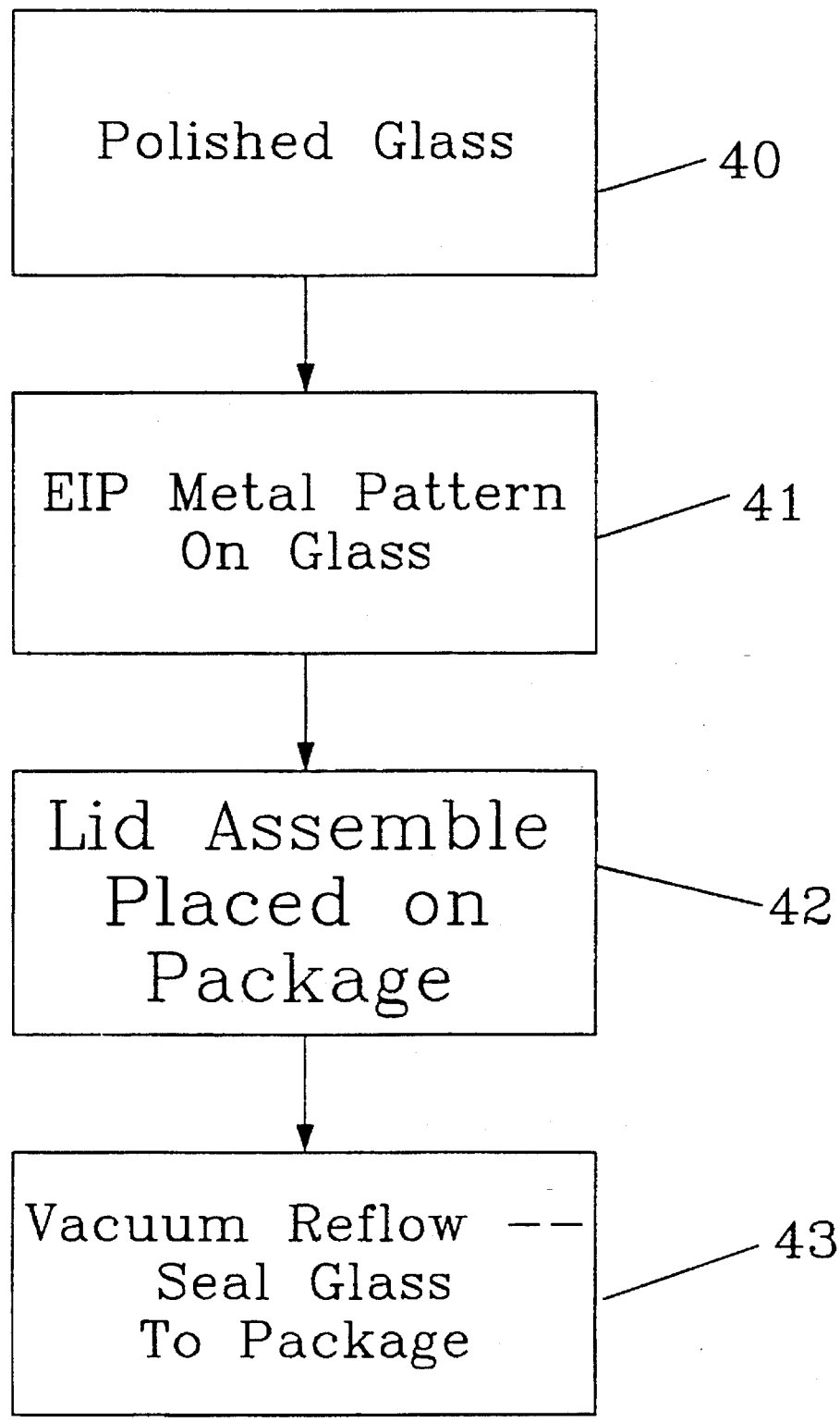
FIG. 5 shows an alternative embodiment of the invention.

FIG. 5 illustrates a second embodiment in which a metal frame is not utilized. A polished optical glass (step 40) is used. An etched area on the optical glass is metallized (step 41), and the unetched area on the optical glass defines the aperture (aperture 25, FIG. 3). The optical glass with the metallized pattern forms the lid assembly (step 42). A solder preform is not used in this embodiment since the lid assembly is sealed to the housing by a vacuum reflow process FIG. 5 (step 43). The process, which includes sealing the deposited metal area on the optical glass to the housing, requires a higher temperature than the process of FIG. 4, step 34, and may provide some limitations as to the types of semiconductor devices that may be used in this package. If the heating is not a limitation, this process has the advantages of a lower cost and reduced process steps.

Figure 6:
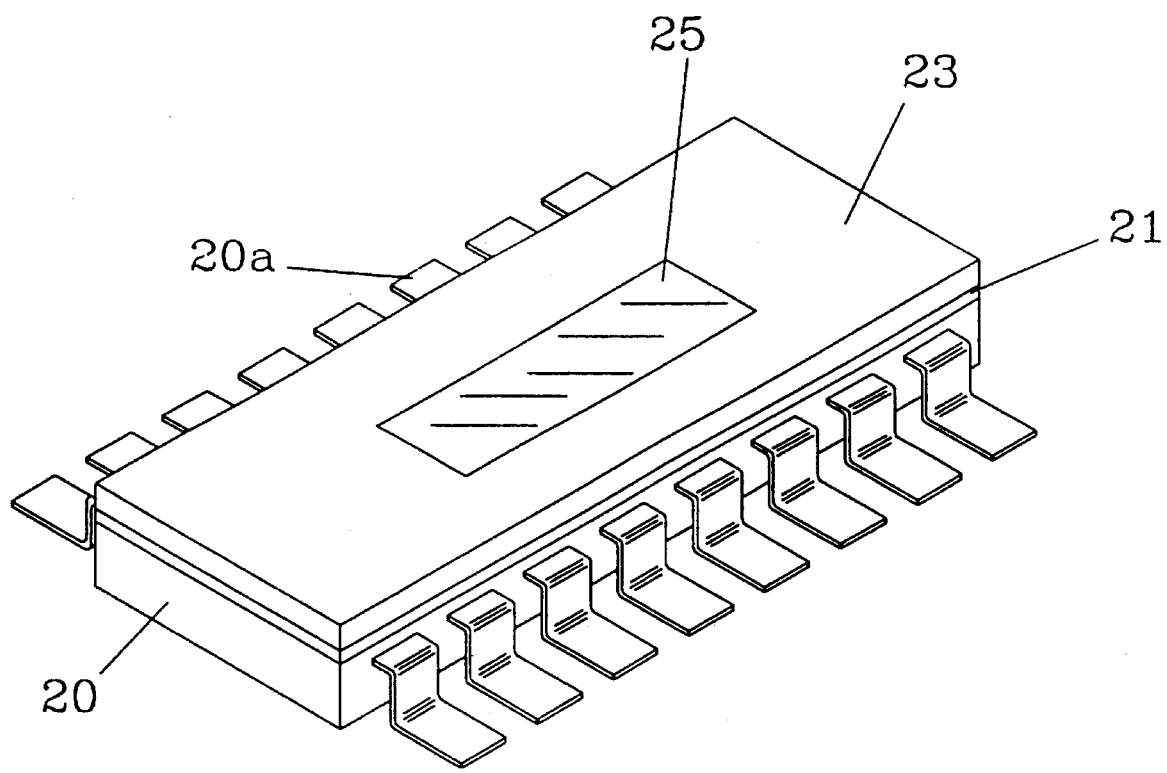
FIG. 6 shows an assembled device, as in FIG. 3, having an optical quality window made according to the invention.

FIG. 6 shows the assembled device of FIG. 3. The lid of optical glass 23, with and optical aperture 25 is sealed to package 20. Package 20 has a plurality of leads 20a extending from at least two sides. The metal frame 21 is shown sealed between glass 23 and package 20.

What is claimed:

1. A semiconductor device package having an optical quality window, comprising:
    a housing having a cavity and a rim surrounding said cavity;
    a semiconductor device mounted in said cavity;
    an optical quality glass plate having a polished bottom surface;
    a metal layer deposited onto said polished glass surface; said metal layer having a CTE that matches the CTE of said glass plate and being deposited from a vapor phase onto said surface using an Enhanced Ion-Plating process; and said metal layer further being patterned in an annular pattern, with a central aperture free of metallization defining an optical window;
    a metal frame, having a CTE that matches the CTE of said glass plate, sealed to said housing rim; and
    a reflowed solder preform sealing said metal layer to the metal frame.

2. The package of claim 1, wherein said glass plate has an area etched with said annular pattern; and said metal layer is deposited over said etched area.

3. The package of claim 1, wherein said reflowed solder preform is a solder preform that has been reflowed using an infrared vacuum reflow heating process.

4. A semiconductor device package having an optical quality window, comprising:
    a housing having a cavity and a metal rim surrounding said cavity;
    a semiconductor device mounted in said cavity;
    an optical quality glass plate;
    polishing a bottom surface of the glass plate;
    a metal layer deposited onto the polished glass surface; said metal layer having a CTE that matches the CTE of said glass plate and being deposited from a vapor phase onto said surface using an Enhanced Ion-Plating process; and said metal layer further being patterned in an annular pattern, with a central aperture free of metallization defining an optical window; and said metal layer being sealed to said metal rim.

5. The package of claim 4, wherein said metal rim comprises a metal seal ring attached to said housing.

6. A hermetically sealed semiconductor device package having an optical quality window, comprising:
    a housing with an opening;
    a semiconductor device mounted in said housing;
    an optical quality glass lid element having a surface;
    a metal layer deposited in an annular pattern onto said surface by high energy particle bombardment ion-plating; said annular pattern having a central aperture free of metallization defining an optical window;
    a metal frame sealed to said housing over said opening; and
    a reflowed solder preform sealing said metal layer to said frame.

7. The package of claim 6, wherein said metal layer is plated onto said surface by vaporizing plating material within an evacuated chamber, in the presence of argon gas plasma having a partial pressure of approximately $1\times10^{-4}$ torr, and applying a negative bias on said surface for attracting positive ions of said vaporized plating material.

8. The package of claim 7, wherein said housing is a ceramic housing further comprising a metal seal ring surrounding said opening; and said metal frame is sealed to said housing metal seal ring.

9. The package of claim 8, wherein said metal layer is plated onto said surface by applying a radio frequency signal to said surface for developing a negative self-bias on said surface.

10. The package of claim 9, wherein said metal layer is plated onto said surface with said bias applied by also applying a direct current negative bias adjacent said surface.

* * * * *